United States Patent [19]

Harris et al.

[11] Patent Number: 5,202,222
[45] Date of Patent: Apr. 13, 1993

[54] SELECTIVE AND PRECISE ETCHING AND PLATING OF CONDUCTIVE SUBSTRATES

[75] Inventors: Martin J. Harris, Leominster; Ivan K. Ho, Marlboro, both of Mass.

[73] Assignee: Shipley Company Inc., Newton, Mass.

[21] Appl. No.: 663,321

[22] Filed: Mar. 1, 1991

[51] Int. Cl.$^5$ ................................ G03C 5/00
[52] U.S. Cl. ................................ 430/315; 430/311; 430/313; 430/319; 204/180.2; 204/108.6; 204/181.1
[58] Field of Search ............... 430/311, 313, 315, 319, 430/322, 324, 327; 204/180.2, 180.6, 181.1, 181.7; 427/98

[56] References Cited

U.S. PATENT DOCUMENTS

| | | | |
|---|---|---|---|
| 3,663,376 | 5/1972 | Uchytil et al. | 430/315 |
| 3,892,646 | 7/1975 | Lazzarini et al. | 204/181 |
| 3,960,561 | 6/1976 | Haining et al. | 430/312 |
| 4,089,733 | 5/1978 | Zimmerman | 156/630 |
| 4,238,385 | 12/1980 | Okado et al. | 204/181 C |
| 4,268,614 | 5/1981 | Ueyama et al. | 430/315 |
| 4,592,816 | 6/1986 | Emmons | 430/327 |
| 4,671,854 | 6/1987 | Ishikawa et al. | 156/659.1 |
| 4,751,172 | 6/1988 | Rodriquez et al. | 430/314 |
| 4,877,818 | 10/1989 | Emmons et al. | 522/26 |
| 5,004,672 | 4/1991 | D'Ottavio et al. | 430/319 |

FOREIGN PATENT DOCUMENTS

| | | |
|---|---|---|
| 0326516 | 8/1989 | European Pat. Off. |
| 52-009646 | 1/1977 | Japan |

*Primary Examiner*—Marion E. McCamish
*Assistant Examiner*—Kathleen Duda
*Attorney, Agent, or Firm*—Robert L. Goldberg; Peter F. Corless

[57] ABSTRACT

Method for selective and precise etching and plating of a conductive substrate through electrophoretic deposition of a photoresist composition. The invention enables chemical milling and plating of products useful in high performance applications such as lead frames with lead widths less than 1.0 mil and precisely plated lead faces.

22 Claims, 1 Drawing Sheet

SELECTIVE AND PRECISE ETCHING AND PLATING OF CONDUCTIVE SUBSTRATES

BACKGROUND OF THE INVENTION

1. Field of the Invention

The present invention relates to an improved process for selective and precise etching and plating of conductive substrates, including a process for selective and precise etching and plating of substrates having irregular topography such as three dimensional substrates.

2. Background Art

Chemical etching is employed to fabricate a wide variety of materials. In general, such an etching process comprises application of a photoresist composition to a material of construction. A typical liquid-type photoresist composition contains a combination of a film forming resin or polymer and a photosensitive compound or a photoiniator dissolved or suspended in an organic solvent composition. After application to a substrate and evaporation of any solvent carrier, the photoresist is selectively exposed through use of a photomask and actinic radiation. By providing areas that are selectively opaque and others that are transparent to the radiation, a pattern is defined and transferred to the photoresist coating layer. The pattern is then developed by treatment of the coating layer with a developer solution. Those portions of the substrate that are exposed by development of the photoresist layer can be chemically milled, for example with a ferric chloride solution, to remove unwanted areas of the material of construction and thereby form a substrate with a structure the same as the pattern transferred through the photomask to the photoresist coating layer. After etching, the resist can be stripped from the substrate with a suitable stripper solution as is known in the art.

A photoresist can be either positive-acting or negative-acting. For a negative photoresist, those coating portions that are exposed to actinic radiation polymerize or cross link in a reaction between the photoinitator and polymerizable reagents of the resist composition. Consequently, those exposed portions are comparatively less soluble in a developer solution than unexposed portions. For a positive-acting photoresist, exposed coating portions are rendered soluble in the developer solution. For both types of resists, the solubility differences between exposed and unexposed coating portions permit construction of a patterned relief image and thus the transfer of an image upon subsequent processing steps.

Photoresist compositions are similarly employed to selectively metal plate or coat (e.g. paint) a surface. In general, a plating or coating step simply replaces the substractive etching step. Thus, a photoresist is applied to a substrate surface; the resist is exposed to provide selectively soluble portions of the photoresist coating; a developer is applied to bare selected portions of the substrate surface; those selected portions are plated or coated; and the remaining resist stripped from the substrate surface.

It is generally desired to apply a uniform photoresist coating on a substrate. This is particularly the case for milling or plating higher performance products where high precision processing steps are required. Uneven and insufficient resist coatings can operate as sites for penetration of an etching solution or plating solution. Uneven coatings also can result in irregular exposure of the resist, providing poor resolution of the developed image or incomplete development if the resist is underexposed.

Most prior processes for application of a photoresist composition on a substrate can be generally characterized as planar coating processes; that is, the resist is directly applied only along a single plane of the substrate rather than evenly across each surface of a multidimensional substrate. Such prior photoresist coating methods include spray coating, dip coating, roller coating, screen coating and dry film.

These planar application methods can be inadequate where the topography of the coated surface is irregular, for example where all surfaces of a three dimensional substrate are to be coated. Thus, a spray application will not apply resist in the same manner or amount to substrate surfaces that directly face the spray applicator as the resist that is applied to substrate surfaces that regress from or otherwise do not directly face the spray applicator. Common coating irregularities include insufficient coverage of all surfaces of the three dimensional substrate, regression of the photoresist from the substrate edges, thinning of the resist at substrates corners and drips and runs of the photoresist, all resulting in areas of uneven application, pinholes in the coating layer and/or uncoated areas.

These planar application methods also can be inadequate for applying a photoresist along a single plane where the substrate surface is irregular. For instance, photoresist will be applied in a different amount or manner in pitted areas than in more uniform areas of an irregular substrate surface. Such problems are significant where resolution demands are high. This is a recognized limitation to the use of dry film. Current dry film lamination application methods will bridge over surface irregularities, generally preventing satisfactory resolution of an etched image of a width of less than about 3 to 4 mils.

Thus, problems posed by uneven photoresist applications are of significant concern in the fabrication, plating or coating of higher performance products where chemical milling of narrow width substrates is required or where a plating or coating application must be strictly limited to a specific area.

Specifically, prior photoresist application methods have been inadequate or of limited application for lead frame manufacture. A lead frame is a sheet metal framework on which an integrated circuit is attached and electrically connected to an electronic printed circuit board. The lead frame provides a mounting surface for a microelectronic integrated circuit from which multiple conductive circuit "leads" laterally extend. Each lead is spaced from each adjacent lead to provide a separate conductive pathway. The top surface of the leads are selectively plated with a conductive metal such as gold or silver to electrically connect individual conductive pads of an integrated circuit to the board circuitry.

The lead frame primary structure is formed by metal stamping or chemically etching a suitable electrically conductive substrate such as a copper or nickel alloy foil. An etching process is preferred for higher performance applications as the process permits greater resolution and thus smaller lead dimensions.

Narrow lead widths are required in many lead frame applications. Each input or output of an integrated circuit requires a separate lead to provide a conductive path to board circuitry. The total number of inputs and outputs of an integrated circuit is known in the art as the "input-output count" or simply the "I/O count". To provide higher functionality, many integrated circuits have I/O counts of 200 or more. Manufacture of integrated circuits of even higher I/O counts is anticipated.

To accommodate such high function integrated circuits, lead frames having a sufficient number of leads or "lead count", i.e. 200 or more leads, are required. Further, it is generally desired not to increase lead frame surface area. Thus the need exists for lead frames having lead widths as narrow as possible to thereby provide the greatest number of leads in the smallest amount of space. However, conventional photoresist application methods such as dry film generally limit successful etching to lead widths not less than about 3 to 4 mils.

Prior photoresist application methods also can be inadequate in the selective plating process of the top surface of leads of a lead frame. For high signal speed applications, that is, lead frames used for electrically connecting electronic devices that operate at frequencies of 10 megahertz ("MHz") or greater, it is crucial that the conductive metal is selectively plated only on the top surface of the lead, and that metal is not deposited along the lead's edges, sidewalls or any other surface of the lead frame not intended for plating. Metal deposition along such surfaces will cause problems in subsequent packaging reliability and compromise electronic performance. Conventional planar photoresist applications methods can insufficiently coat lead frames edges or sidewalls and thus fail to restrict or limit plating to lead top surfaces.

Electrodeposition involves a process of electrophoresis which is the motion of charged particles through a liquid medium under the influence of an applied electrical current. The deposition is conducted in an electrolytic cell where the conductive surface to be coated serves as one electrode. A charged polymer suspended typically as a colloidal emulsified dispersion in a liquid medium is electrophoretically deposited on an oppositely charged electrode. Deposition of a positively charged polymer on a negatively charged cathode is referred to as cataphoresis while deposition of a negatively charged polymer on a positively charged anode is known as anaphoresis.

Electrodeposition of photosensitive coatings is generally known. See, for example, U.S. Pat. Nos. 3,738,835; 3,954,587; 4,029,561; 4,035,273 and 4,035,274. Electrodeposition of photosensitive polymer compositions is described in U.S. Pat. Nos. 4,592,816 and 4,414,311, both incorporated herein by reference.

Most known photoresist compositions are not suitable for use in an electrophoretic lead frame manufacturing process. For example, typical etching and plating solutions, for example a ferric chloride or cupric chloride etching solution and silver or gold cyanide plating solutions, are quite aggressive and can leach a photoresist coating, resulting in etching or plating on surfaces not intended for treatment. Such irregular etching and/or plating is unacceptable for manufacture of many substrates, for example lead frames used in high performance applications such as connecting an integrated circuit with a high I/O count or a circuit operated at high frequencies.

SUMMARY OF THE INVENTION

The present invention provides an improved process for selective and precise etching and plating of a conductive substrate, including a conductive substrate having irregular topography. More specifically, the invention provides a process for precision manufacture of a three dimensional substrate by chemical etching comprising the steps of electrophoretically applying a photoresist composition on a conductive substrate; exposing and developing the photoresist on the conductive substrate; and chemically etching the portions of the conductive substrate exposed by development of the photoresist. The invention further provides a process for selective and precise plating of a conductive substrate comprising the steps of electrophoretically applying a photoresist composition on the conductive substrate; exposing and developing the photoresist on the conductive substrate; and metal plating the portions of the conductive substrate exposed by development of the photoresist.

While a number of photoresist compositions may be employed, the photosensitive composition comprises an aqueous solution or emulsion preferably containing one or more polymers having carrier groups, a photoinitiator, and a suitable source of unsaturation for cross linking the composition upon exposure of the photoinitiator to actinic radiation. Alternatively, the source of unsaturation can be present in a polymer present in the photosensitive polymer composition itself. It has been found that this photosensitive composition provides a uniform coating upon electrodeposition onto a conductive substrate and provides a coating with a high resistance to degradation from aggressive processing chemicals such as etching and plating solutions. To further promote a uniform resist coating, the composition preferably includes one or more coalescing agents and the conductive substrate is vibrated during electrodeposition.

It has been found that the present invention is advantageously employed in the manufacture of lead frames. The invention enables chemical milling of leads of a width of less than about 1.0 mils, including leads widths of about 0.5 mils, thus enabling manufacture of lead frames with lead counts sufficient to connect high I/O count integrated circuits. Further, in contrast to results achieved with many prior coating systems, the process of the invention provides a uniform photoresist coating on all conductive surfaces of a three dimensional lead frame including lead edges and sidewalls. Upon exposure and development of the resist coating, the top surface or "face" of a lead may be selectively plated without metal deposition along lead edges, sidewalls or elsewhere on the lead frame. Hence, lead frames suitable for high speed applications may be manufactured, including lead frames suitable for electrically connecting electronic devices operating at frequencies of 10 MHz or greater.

The term "conductive surface" as used herein means any surface sufficiently conductive to permit electrophoretic deposition of an organic coating composition.

BRIEF DESCRIPTION OF THE DRAWING

A more complete understanding of the invention may be provided by reference to the accompanying Drawing wherein.

DESCRIPTION OF THE PREFERRED EMBODIMENTS

Figure 1:
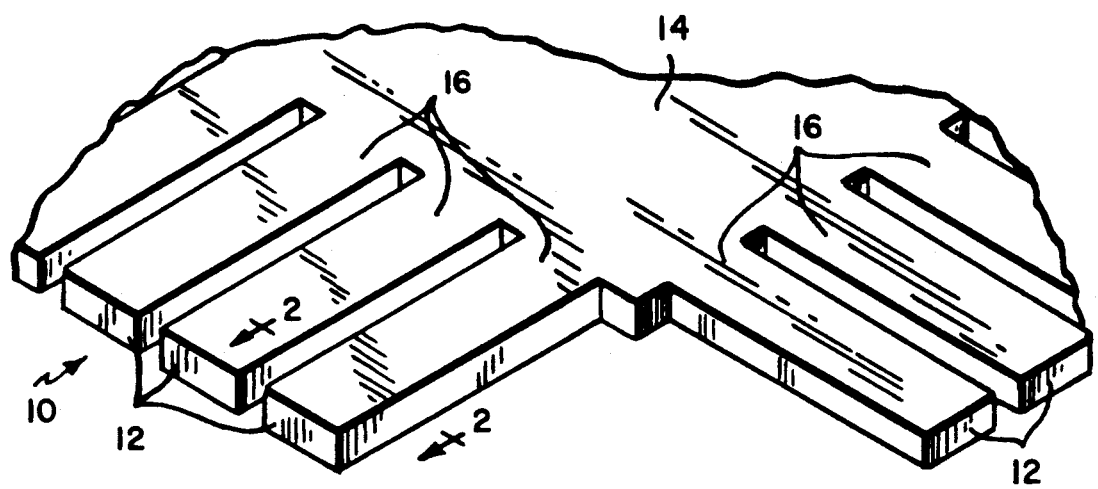
FIG. 1 is an enlarged broken-away isomeric view of a lead frame.

The photoresist composition suitable for use in the present invention may be of a variety of specific formulations, for example, the photoresist coating compositions described in U.S. Pat. Nos. 4,845,012; 4,632,900; 4,592,816, all of which are incorporated herein by reference. The photoresist compositions may be positive acting or negative acting.

Suitable photoresist compositions are aqueous solutions or emulsions comprising at least one polymer containing a polar carrier group, a photoinitiator or photoactive compound in the case of a positive mode resist and a suitable cross linking agent, the cross linker preferably being an unsaturated monomer. The aqueous solution or emulsion is typically acidic, for example by the addition of lactic acid, although a basic solution may also be employed.

A carrier group is a positively or negatively charged polar group, or a amphoteric group capable of being positively or negatively charged upon reaction with an acid or base, respectively. Carrier groups enable convenient development of an exposed photoresist coating by treatment of an appropriately charged aqueous developer solution. As discussed herein, the polymer carrier also determines the electrode on which the photoresist deposits.

Suitable polymers for use in the resist composition are typically addition and/or condensation polymers having the aforesaid polar carrier groups. Addition polymers having carrier groups prepared from monomers having ethylenic unsaturation are preferred. Polymers containing carrier groups that are useful in the photosensitive polymer composition include acrylic polymers, vinyl polymers other than acrylic polymers, epoxy polymers, polyurethanes, polyesters and polyamides.

Polymers having positively charged polar carrier groups, i.e., cataphoretic carrier groups, will deposit on a negatively charged electrode. Such carrier groups include, for example, quaternary ammonium groups and phosphonium groups which become positively charged upon reaction with an acid. The acids that are useful to protonate the carrier groups of the polymers include lactic acid, glycolic acid, hydroxyacetic acid, hydrochloric acid, formic acid, acetic acid and phosphoric acid.

Polymers having negatively charged polar groups, i.e., anaphoretic carrier groups, will deposit on a positively charged electrode. Carboxylic acid groups are suitable negatively charged carrier groups.

The preferred compositions suitable for electrodeposition are formed by mixing the polymer containing carrier groups with at least one unsaturated monomer and a photoinitiator so that a polymer film electrodeposited on a surface is capable of being polymerized into a cross linked polymer when exposed to actinic radiation. Unsaturated monomers comprising at least two unsaturated groups are preferred cross linking agents. Particularly preferred are the multi-functional monomers having two or more acrylates or methacrylate groups. Examples of suitable monomers are set forth in U.S. Pat. No. 4,592,816.

Examples of photoinitiators suitable for use in the polymeric composition include azo compositions, sulfur-containing compounds, metallic salts and complexes, oxines, amines, polynuclear compounds, organic carbonyl compounds, various quinones, etc. Specific examples of suitable photoinitiators are also set forth in U.S. Pat. No. 4,592,816.

As apparent to those skilled in the art, the photoresist also may contain other additives such as dyes, plasticizers and surfactants or surface active agents as are customarily used in an electrodeposition bath. These additional components generally serve to promote adhesion and uniformity of the resist coating as applied on a conductive substrate. For example, dyes serve to enhance visual contrast and to facilitate inspection and subsequent repair (if necessary) of the resist coating.

In order to promote uniform application of the photoresist to the conductive substrate, a coalescent agent preferably is added to the photoresist composition. The coalescent agent partitions into and/or out of photoresist micelles and is thus codeposited with those micelles, allowing the resist coating to form a coherent deposit during application. The coalescent agent also softens the micelles resulting in a coating which, unlike many prior coatings, is thin and pinhole free and flexible as the result of a plasticization effect.

Preferred coalescent agents include both water soluble or partially water soluble and water insoluble agents. Of the water soluble or partially water soluble agents, preferred compounds include 1-nitropropane, 2-nitropropane, M-Pyrol (methyl pyrrolidone), ethylene glycol ethylhexylether, propylene glycol methylether, high molecular weight polypropylene glycols and Texanol (2,2,4-trimethyl-1,3-pentanediol monoisobutyrate from Eastman Kodak). Mixtures of two or more coalescent agents also may be used. Other coalescent agents include copolymers of ethyl acrylate such as Modaflow (Monsanto); surfactants such as oleyl alcohol, Flexrecin (polyol ricinoleates from CasChem), FC 430 (fluorocarbon surfactant from 3M), and Foam kill 639AA (defoamer). Lubricants useful as coalescent agents include oleoamide and high molecular weight polymers such as Lubrizol 5907. Waxes also may be used as coalescent agents, for example EM-11 and EM-937 (from Axel Manufacturing). A preferred coalescent agent is ethylene glycol ethylhexylether.

The coalescent agent is normally added to the organic phase prior to emulsification, i.e., prior to the addition of water to the components of the electrodeposition bath. In general, for water soluble or partially water-soluble coalescent agents, the amount may be up to about 25% by weight of the emulsion (including both solids and the aqueous portion), preferably between about 10-20% by weight, and most preferably between about 14-18% by weight. For water insoluble coalescent agents, the amount may be up to about 15% by weight of solids used to form the emulsion, preferably between about 2-10% by weight, and most preferably between about 4-6% by weight.

During electrodeposition of the described photoresist composition, the conductive substrate is disposed in the electrodeposition solution and serves as an electrode, either as the cathode or the anode depending on the polymer carrier groups. If the polymer of the photoresist composition comprises positively charged carrier groups, the resist is deposited cataphoretically by applying a negative charge to the conductive substrate. Similarly, for polymers comprising negatively charged carrier groups, the photoresist is deposited anaphoretically by applying a positive charge to the conductive substrate.

Preferably, the conductive substrate is vibrated during deposition of the photoresist to avoid coating irregularities. Gases are generated in the deposition bath during electrolysis. Such gases will adhere to the substrate disposed in the bath and upon photoresist deposition will result in pinholes and other coating flaws. This problem is generally obviated by vibrating the substrate during electrolysis at a sufficient frequency and amplitude to dislodge any gases that may adhere to the substrate surface.

The conductive susbtrate is conveniently vibrated by attaching a suitable motor to the deposition vessel. For example, an electric type motor or pneumatic type motor may be used, although it is clear that other devices capable of providing the described vibrations also could be employed, for example a transducer. In general, the vibrating device is operated to provide between about 60 and 30,000 vibrations per minute and, preferably, at least 3,000 vibrations per minute. Preferably, the vibration device is mounted on the deposition vessel whereby the vibrations are isolated and transferred directly to the conductive substrate disposed in the bath.

Exposure of the deposited photoresist is achieved by use of an appropriate phototool containg areas that are selectively opaque and transparent to actinic radiation and by other methods well known in the art, for example, the procedures disclosed in D. S. Elliot, *Integrated Circuit Fabrication Technology*, chapter 8, pp. 165-207 (McGraw Hill 1982), incorporated herein by reference. Development is also well known. One preferred development process involves the use of a dilute organic acid, as described in U.S. Pat. No. 4,592,816, at columns 12-14. After development of the exposed resist coating, the conductive substrate may be selectively processed, for example chemically milled or plated. After such processing, the photoresist on the remainder of the substrate is then stripped with a suitable acidic stripper solution such as stripper solutions identified as XP 9017 and XP 6504, both sold by the Shipley Company of Newton, Mass.

It has been found that the processes of the invention are advantageously employed in the manufacture of lead frames. A suitable conductive foil, for example a copper foil, or a nickel iron alloy or a copper alloy such as copper alloy 194 (Olin Chemical), is immersed in the described photoresist composition, connected to a source of electrical potential and the photoresist bath is subjected to electrolysis to thereby deposit a uniform photoresist on all surfaces of the foil. The photoresist may be positive acting or negative acting. The electrodeposition is typically conducted at about 20° C. and at about 70 volts for about 15 seconds to provide a photoresist coating of thickness of between about 600 to 700 microinches. When a relief image is available, the thickness of deposited photoresist coating may be measured, for example by use of a beta backscatter instrument such as "Microderm" (UPA Technology), or by use of a profilometer such as "Dektak" (Sloan Technology Company).

The photoresist coating layer is then developed and the exposed substrate surfaces treated with a suitable etchant such as ferric chloride or cupric chloride. The photoresist patterns are then stripped with an acidic stripper solution by conventional techniques from the resulting etched lead frame.

A lead frame also may be selectively plated according to the present invention to provide conductivity means suitable for electronic devices operating at high frequencies. Thus, the described photoresist composition is electrodeposited on a lead frame and selectively exposed to actinic radiation so that upon development only the top surface of the lead frames' leads are bared of photoresist. These exposed surfaces then may be plated either electrolessly or electrolytically with a conductive metal. Suitable conductive metals include, for example, gold, silver, palladium, rhodium and ruthenium, with gold and silver being most typically used. Some applications require plating several metal layers as well as plating to varying thickness. A 30 microinch gold deposit is common. Suitable plating conditions and solutions are those well known in the art, for example the procedures described in Coombs, *Printed Circuits Handbook*, pp. 12.38-12.47 (McGraw Hill, 3d ed. 1988); and Kirk-Othmer, *Encyclopedia of Chemical Technology*, vol. 8, pp. 826-869 (3d ed. 1979), both incorporated herein by reference. A preferred gold plating sequence comprises treatment of the leads with an aqueous surfactant solution to wet the lead frame surface, microetch, strike plate and then electroplate with a gold cyanide bath. After plating, photoresist remaining on the lead frame is stripped.

To achieve a uniform and otherwise acceptable metal deposit on the lead, it is crucial to adequately pre-clean top face of the the leads to remove essentially all traces of organic substances, i.e. the photoresist or any other susbtance, that may still remain after treatment with the developer solution. Such pre-cleaning can be performed by a variety of means as is apparent to those skilled in the art, for example treatment with a suitable cleaning solution such as the acidic aqueous solution identified as acid cleaner 742 (Shipley Company) or the neutral aqueous cleaner solution identified as Neutraclean (Shipley Company).

Figure 2:
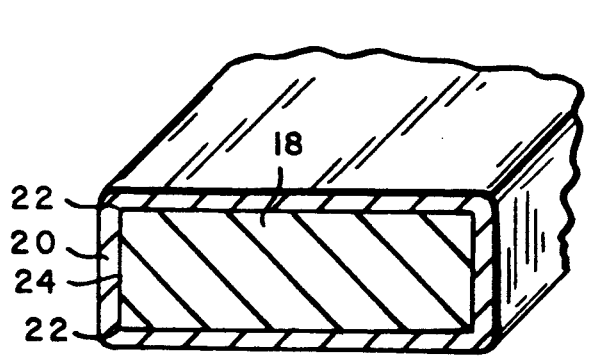
FIG. 2 is an above cross-sectional view, taken along the line 2—2 of FIG. 1, of a lead after electrodeposition of the photoresist composition.
Figure 4:
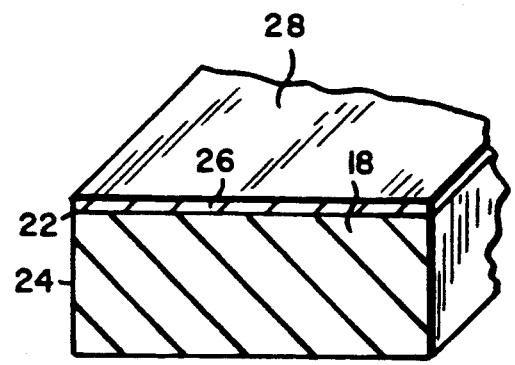
FIG. 4 is an above cross-sectional view, taken along the line 2—2 of FIG. 1, of a lead after metal plating of the lead top face and stripping of the photoresist coating.
Figure 3:
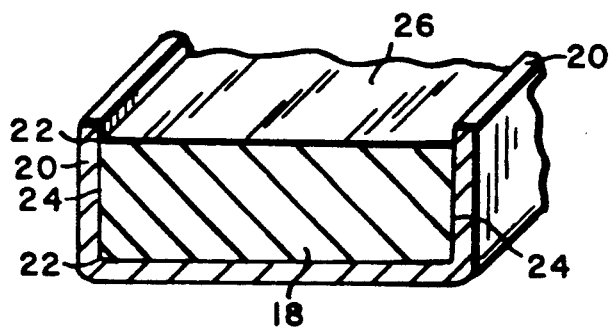
FIG. 3 is an above cross-sectional view, taken along the line 2—2 of FIG. 1, of a lead after development of the photoresist coating.

Referring now to the Drawing, FIG. 1 depicts three dimensional lead frame 10 to be treated by the invention. Plurality of leads 12 laterally extend from mounting area 14. During use, an integrated circuit (not shown) is attached to mounting area 14 and communicates with proximal ends 16 of leads 12. FIG. 2 shows a single lead 18 after electrodeposition of the photoresist composition according to the invention. The deposition of photoresist coating layer 20 is uniform on all surfaces of the three dimensional lead 18 including lead edges 22 and lead sidewalls 24. FIG. 3 shows lead 18 after development of the photoresist coating layer to expose the top surface 26 only of the lead. As shown in FIG. 3, edges 22 and sidewalls 24 of lead 18 are fully coated to thereby prevent metal deposition thereon. FIG. 4 shows lead 18 after photoresist electrodeposition, exposure, development, metal plating and resist stripping according to the invention. Metal layer 28 is plated only on the top face 26 of lead 18. Metal is not plated on edges 22 or sidewalls 24 of lead 18.

The invention will be better understood by reference to the following examples.

EXAMPLE 1

A preferred electrodepositable photoresist composition is as follows:

| Ingredient | Amount |
| --- | --- |
| Polymer | 91.0 g |
| Dimethylaminoethyl methacrylate | 8 parts |
| Methyl methacrylate | 75 parts |
| Ethyl acrylate | 17 parts |
| Monomer | 46.0 g |
| Dipentaerythritol monohydroxy penta-acrylate | |
| Dye | 1.1 g |
| Morton ERO Blue from Morton Thiokol | |
| Coalescent Agent | 160.0 g |
| Propylene glycol methylether | |
| Photoinitiators | 11.0 g |
| 2-methyl-1-[4-(methylthio)phenyl]- | 8.3 g |
| 2-morpholino-propan-1-one | |
| Isopropylthioxanthone | 2.7 g |
| Acid | 15.0 g |
| Lactic Acid 20% | |
| Distilled Water to make up | 1000 g |

Electrodeposition of this composition can be carried out as follows.

The above photoresist composition is added to a vessel such as a 1 liter beaker. A 1 inch×2 inch stainless steel plate is used as the anode and the cathode is one or more lead frames to be coated with photoresist. The photoresist composition is deposited at about 20° C. at about 70 volts for about 1 minute to provide a photoresist coating of thickness between about 0.5 to 0.6 mil. Preferably the one or more lead frames are vibrated during deposition of the photoresist.

EXAMPLE 2

A selectively plated lead frame is produced by the process of the invention as follows.

A standard copper alloy 194 (Olin Chemical) foil sheet is etched to provide an 18 inch by 24 inch substrate comprising multiple lead frames. Photoresist is then stripped from the etched substrate with XP 9017 stripper soluton (Shipley Company).

Essentially all traces of organics are removed from the lead frames with acid cleaner 742 solution (Shipley Company) at about 135° F. for 2 minutes and water rinsed. After such cleaning, the lead frame is microetched to about 20 microinches.

The cleaned lead frame is pre-dipped in a bath of the electrodeposition composition of Example 1 for approximately 10 seconds, withdrawn from the solution, and then resubmerged in the bath for coating. Electrodeposition conditions are generally those described in Example 1, a constant voltage of approximately 70 volts with regular vibration of the lead frame. Electrodeposition is continued for approximately 1 minute until formation of a photoresist deposit of about 0.6 mil thickness.

Following deionized water rinse, the lead frame is immersed in a 5.0% aqueous XP 8751 solution (Shipley Company), a hydroxy cellulose-based top coat solution for tack reduction, for approximately 10 seconds and then is withdrawn from the solution at a steady rate over a 10 second period. The coated lead frame is then air-dried at room temperature followed by baking at about 130° F. for approximately 3 minutes. Using an approximate phototool, the top surface of the leads are exposed at between about 300 to 1,000 mJoules.

The photoresist is then developed by immersion in the stripper solution identified as XP 9006 solution (an acidic solution sold by Shipley Company) at 100° F. for approximately 5 minutes. The lead frame is then completely dried at between about 140° F. to 200° F. The top surface of the leads are then electroplated by immersion in a gold cyanide plating solution, connected to a source of electric potential and the plating solution subjected to electrolysis. After gold plating the top surface of the leads, the undeveloped resist is stripped with a stripping solution.

The foregoing description of the invention is merely illustrative thereof, and it is understood that variations and modifications can be effected without departing from the spirit or scope of the invention as set forth in the following claims.

We claim:

1. A process for plating a lead frame, the lead frame having leads extending from a mounting area on which an integrated circuit or other electronic device can be mounted, the process comprising:
   (a) electrophoretically applying a photoresist composition on the lead frame;
   (b) exposing and developing the photoresist whereby the top face of the leads are selectively bared of photoresist;
   (c) after said exposing and developing of the photoresist, cleaning the top face of the leads that are bared of photoresist to remove essentially all traces of organic substances thereon; and
   (d) after said cleaning of the top face of the leads that are bared of photoresist, metal plating the bared top face of the leads.

2. The process of claim 1 where the photoresist is applied uniformly on the edges and sidewalls of the leads.

3. The process of claim 1 where the photoresist is applied uniformly on all conductive surfaces of the lead frame.

4. The process of claim 1 where the top face of the leads are cleaned with a cleaning solution.

5. The process of claim 4 where the top face of the leads are cleaned with an acidic aqueous solution.

6. The process of claim 4 where the top face of the leads are cleaned with a neutral aqueous solution.

7. The process of claim 1 where the photoresist composition is a negative-acting composition.

8. The process of claim 1 where the photoresist composition is a positive-acting composition.

9. The process of claim 1 where the photoresist composition comprises a solvent, an organic polymer, an unsaturated monomer, a photoinitiator, an electrolyte and water.

10. The process of claim 1 where the photoresist composition comprises dimethylamino methacrylate, methyl methacrylate, ethyl acrylate, dipentaerythritol monohydroxy penta-acrylate, propylene glycol methylether, one or more photoinitiators, lactic acid and water.

11. The process of claim 1 where the photoresist composition comprises a coalescing agent.

12. The process of claim 11 where the coalescing agent is selected from the group consisting of 1-nitropropane, 2-nitropropane, methyl pyrrolidoine, ethylene glycol ethylhexylether, propylene glycol methylether, 2,2,4-trimethyl-1,3-pentanediol monoisobutyrate, and mixtures thereof.

13. The process of claim 1 where the leads of the lead frame have a width of less than about 1.0 mils.

14. The process of claim 1 where the leads of the lead frame have a width of between about 0.5 and 1.0 mils.

15. The process of claim 1 where the leads of the lead frame have a width of about 0.5 mils.

16. The process of claim 1 where the lead frame is vibrated during application of the photoresist whereby gas bubbles adhering to the substrate are dislodged.

17. The process of claim 1 where the metal is electrolessly plated.

18. The process of claim 1 where the metal is electrolytically plated.

19. The process of claim 1 where the metal plated on the conductive surface is selected from the group consisting of gold, silver, palladium, rhodium and ruthenium.

20. The process of claim 1 where the lead sidewalls are substantially free of the metal plated on the top face of each of the leads.

21. The process of claim 1 where the lead edges are substantially free of metal plated on the lead edges.

22. The process of claim 1 where the lead frame can be used for electronic systems operating at frequencies of 10 megahertz or greater.

* * * * *